United States Patent
Mizushima

(10) Patent No.: US 7,767,361 B2
(45) Date of Patent: Aug. 3, 2010

(54) HOLOGRAM RECORDING MATERIAL, PROCESS FOR PRODUCING THE SAME AND HOLOGRAM RECORDING MEDIUM

(75) Inventor: Tetsuro Mizushima, Moriguchi (JP)

(73) Assignee: TDK Corporation, Tokyo (JP)

( * ) Notice: Subject to any disclaimer, the term of this patent is extended or adjusted under 35 U.S.C. 154(b) by 477 days.

(21) Appl. No.: 10/563,815

(22) PCT Filed: Jun. 30, 2004

(86) PCT No.: PCT/JP2004/009605
§ 371 (c)(1),
(2), (4) Date: Jan. 6, 2006

(87) PCT Pub. No.: WO2005/006086
PCT Pub. Date: Jan. 20, 2005

(65) Prior Publication Data
US 2006/0172203 A1    Aug. 3, 2006

(30) Foreign Application Priority Data
Jul. 10, 2003   (JP) .............................. 2003-194817

(51) Int. Cl.
*G03H 1/02*   (2006.01)
(52) U.S. Cl. .................... 430/1; 430/2; 430/281.1; 430/280.1; 359/3
(58) Field of Classification Search ............... None
See application file for complete search history.

(56) References Cited

U.S. PATENT DOCUMENTS 4,863,831 A * 9/1989 Hiruma et al. ............ 430/271.1
4,942,112 A * 7/1990 Monroe et al. ............ 430/282.1
5,622,782 A * 4/1997 Poutasse et al. ............. 428/344
5,658,966 A * 8/1997 Tsukamoto et al. ........... 522/99

(Continued)

FOREIGN PATENT DOCUMENTS

EP   938027   *   8/1999

(Continued)

OTHER PUBLICATIONS

Loy, et al., "Substituent effect on the sol-gel chemistry of organotriakoxysilanes", Chem. Mater., vol. 1212) pp. 3624-36-32 (2000).*

(Continued)

*Primary Examiner*—Martin J Angebranndt
(74) *Attorney, Agent, or Firm*—Oblon, Spivak, McClelland, Maier & Neustadt, L.L.P.

(57) ABSTRACT

The present invention provides a hologram recording material which attains high refractive index change, high sensitivity, low scattering, environment resistance, durability, low dimensional change and high multiplicity, and is suitable for volume hologram recording; a process for producing the hologram recording material; and a hologram recording medium. A hologram recording material comprising a metal oxide matrix and a photopolymerizable compound, said metal oxide matrix having a halogen-containing organic group. The metal oxide matrix is formed by hydrolysis and polymerization reaction of a metal alkoxide compound, and said metal alkoxide compound includes a metal alkoxide compound represented by the following general formula (1):

$$(R_H)_m M(OR)_n \qquad (1)$$

wherein $R_H$ represents the halogen-containing organic group, R represents an alkyl group, M represents a metal atom, m represents 1 or 2, and m+n represents the valence of the metal atom M.

12 Claims, 1 Drawing Sheet

U.S. PATENT DOCUMENTS

| | | | | |
|---|---|---|---|---|
| 5,693,172 | A * | 12/1997 | Zeldin et al. | 156/307.3 |
| 6,524,771 | B2 * | 2/2003 | Maeda et al. | 430/290 |
| 7,039,289 | B1 * | 5/2006 | Mendoza et al. | 385/132 |
| 2002/0110740 | A1 * | 8/2002 | Otaki et al. | 430/1 |
| 2003/0021566 | A1 * | 1/2003 | Shustack et al. | 385/129 |
| 2005/0068593 | A1 * | 3/2005 | Hayase et al. | 359/1 |
| 2007/0111107 | A1 * | 5/2007 | Yoshinari et al. | 430/1 |
| 2007/0111108 | A1 * | 5/2007 | Hayashida et al. | 430/1 |
| 2007/0243473 | A1 * | 10/2007 | Mizushima et al. | 430/2 |
| 2007/0243474 | A1 * | 10/2007 | Mizushima et al. | 430/2 |
| 2008/0057405 | A1 * | 3/2008 | Yoshinari et al. | 430/2 |
| 2008/0057406 | A1 * | 3/2008 | Hayashida et al. | 430/2 |
| 2008/0076033 | A1 * | 3/2008 | Hayashida et al. | 430/2 |

FOREIGN PATENT DOCUMENTS

| | | |
|---|---|---|
| JP | 8-220975 | 8/1996 |
| JP | 2953200 | 7/1999 |
| JP | 11-344917 | 12/1999 |
| JP | 2000-275859 | 10/2000 |
| JP | 2001-56631 | 2/2001 |
| JP | 2001-109360 | 4/2001 |
| JP | 2002-236439 | 8/2002 |
| WO | 03/077033 | 9/2003 |

OTHER PUBLICATIONS

U.S. Appl. No. 11/953,325, filed Dec. 10, 2007, Kosuda, et al.
U.S. Appl. No. 11/964,464, filed Dec. 26, 2007, Hayashida, et al.
U.S. Appl. No. 12/021,686, filed Jan. 29, 2008, Kosuda, et al.
U.S. Appl. No. 12/061,971, filed Apr. 3, 2008, Hayashida, et al.
U.S. Appl. No. 12/109,000, filed Apr. 24, 2008, Kosuda, et al.
U.S. Appl. No. 12/236,123, filed Sep. 23, 2008, Yoshinari, et al.
U.S. Appl. No. 12/243,077, filed Oct. 1, 2008, Hayashida, et al.
U.S. Appl. No. 12/235,958, filed Sep. 23, 2008, Hayashida, et al.
U.S. Appl. No. 12/356,979, filed Jan. 21, 2009, Kosuda, et al.
U.S. Appl. No. 12/556,965, filed Sep. 10, 2009, Hayashida, et al.

* cited by examiner

US 7,767,361 B2

HOLOGRAM RECORDING MATERIAL, PROCESS FOR PRODUCING THE SAME AND HOLOGRAM RECORDING MEDIUM

TECHNICAL FIELD

The present invention relates to a hologram recording material suitable for volume hologram recording, a process for producing the same, and a hologram recording medium having the hologram recording material.

BACKGROUND ART

Research and development of holographic memories have been advanced as large-capacity recording technique making high-speed transmission possible. O plus E, vol. 25, No. 4, 385-390 (2003) describes basic structures of holographic memories and a coming prospect thereof.

Examples of the property required for a hologram recording material include high refractive index change at the time of recording, high sensitivity, low scattering, environment resistance, durability, low dimensional change, and high multiplicity. As a hologram recording material, there is known a photopolymer material made mainly of an organic binder polymer and a photopolymerizable monomer. However, the photopolymer material has problems about environment resistance, durability and others. In order to solve the problems of the photopolymer material, attention has been paid to an organic-inorganic hybrid material made mainly of an inorganic matrix and a photopolymerizable monomer, and the hybrid material has been investigated. The inorganic matrix is excellent in environment resistance and durability.

For example, Japanese Patent No. 2953200 discloses a film for optical recording wherein a photopolymerizable monomer or oligomer and a photopolymerization initiator are contained in an inorganic substance network film. It is also disclosed that the brittleness of the inorganic network film is improved by modifying the inorganic network organically. However, the compatibility between the inorganic substance network and the photopolymerizable monomer or oligomer is bad. Therefore, a uniform film is not easily obtained. It is particularly difficult to form a uniform film when the film is made into a film thickness of 100 µm or more, which is necessary for attaining high multiplicity. The nonuniformity of the film causes a problem of light scattering. When the film thickness is 100 µm or more, the light scattering becomes a very serious problem. Specifically, the transmittance of the hologram recording material is lowered by the light scattering, and noises are generated in recorded data by scattered light. In the above publication, recording properties, such as scattering in a film having a thickness of 100 µm or more, are not investigated.

JP-A-11-344917 discloses an optical recording medium wherein an organic-inorganic hybrid matrix contains an optically active monomer. In the organic-inorganic hybrid matrix, a metal element has an alkyl group (a methyl group) or an aryl group (a phenyl group). However, the introduction of the methyl group makes it impossible to improve the compatibility between the hybrid matrix and the optically active monomer. The introduction of the phenyl group gives a more improvement in the compatibility than the introduction of the methyl group. However, the introduction of the phenyl group causes a fall in the curing speed of a hybrid matrix precursor ([0015] in the above publication), and causes a rise in the refractive index of the hybrid matrix. If the refractive index of the hybrid matrix becomes high to approach the refractive index of the optically active monomer or a polymer therefrom, a high refractive index change is not easily obtained at the time of recording. This fact makes the flexibility in recording medium design narrow.

JP-A-2002-236439 discloses a hologram recording material comprising: a matrix made of an organic-inorganic hybrid polymer obtained by copolymerizing an organic metallic compound containing an ethylenically unsaturated double bond and an organic monomer having an ethylenically unsaturated double bond, as main chain constituting components, and/or a hydrolyzed polycondensate thereof; a photopolymerizable compound; and a photopolymerization initiator. By the introduction of the large organic main chain component into the matrix material, the compatibility between the matrix and the photopolymerizable compound is improved. However, the introduction of the large organic main chain component permits the presence of a two-component structure of the organic main chain and an inorganic network in the matrix material. Thus, it appears that the matrix may not exhibit unified behavior at the time of recording so as to cause nonuniform recording. If the ratio of the organic main chain component in the matrix is large, the same problems as in the case of the above-mentioned photopolymer material, which uses an organic binder polymer, are caused.

DISCLOSURE OF THE INVENTION

Objects of the Invention

Thus, an object of the present invention is to provide a hologram recording material which attains high refractive index change, high sensitivity, low scattering, environment resistance, durability, low dimensional change and high multiplicity, and is suitable for volume hologram recording. Another object of the present invention is to provide a process for producing the hologram recording material. Still another object of the present invention is to provide a hologram recording medium having the hologram recoding material.

SUMMARY OF THE INVENTION

The present inventor has made eager investigations so as to find out that when a halogen-containing organic group is introduced into a metal oxide matrix, it is possible to obtain a hologram recording material having a remarkably improved compatibility between the matrix and a photopolymerizable compound and a remarkably improved compatibility between the matrix and an organic polymer generated at the time of recording.

The present invention is a hologram recording material comprising a metal oxide matrix and a photopolymerizable compound, said metal oxide matrix having a halogen-containing organic group.

The present invention is the hologram recording material, wherein said halogen-containing organic group is a halogenated hydrocarbon group.

The present invention is the hologram recording material, wherein the metal oxide matrix is formed by hydrolysis and polymerization reaction of a metal alkoxide compound, and said metal alkoxide compound includes a metal alkoxide compound represented by the following general formula (1):

$$(R_H)_m M(OR)_n \qquad (1)$$

wherein $R_H$ represents a halogen-containing organic group, R represents an alkyl group, M represents a metal atom, m represents 1 or 2, and m+n represents the valence of the metal atom M.

The present invention is the hologram recording material, wherein the metal oxide matrix is made mainly of an oxide of silicon.

The present invention is the hologram recording material, wherein said photopolymerizable compound has an aromatic ring.

The present invention is the hologram recording material, further comprising a photopolymerization initiator.

The present invention is a process for producing a hologram recording material, comprising the steps of:

hydrolyzing a metal alkoxide compound which includes a metal alkoxide compound represented by the following general formula (1):

$$(R_H)_m M(OR)_n \qquad (1)$$

wherein $R_H$ represents a halogen-containing organic group, R represents an alkyl group, M represents a metal atom, m represents 1 or 2, and m+n represents the valence of the metal atom M, thereby yielding a precursor of a metal oxide matrix;

mixing a photopolymerizable compound before or after said hydrolysis; and curing the metal oxide matrix precursor mixed with the photopolymerizable compound, thereby forming a metal oxide matrix.

The present invention is a hologram recording medium having the hologram recording material.

According to the present invention, a halogen-containing organic group is introduced into a metal oxide matrix, so that it is possible to provide a hologram recording material having a remarkably improved compatibility between the matrix and a photopolymerizable compound and a remarkably improved compatibility between the matrix and an organic polymer generated at the time of recording. By use of the hologram recording material of the present invention, there is provided a hologram recording medium having a recording film thickness of 100 μm or more, which is suitable for data storage.

MODES FOR CARRYING OUT THE INVENTION

Figure 1:
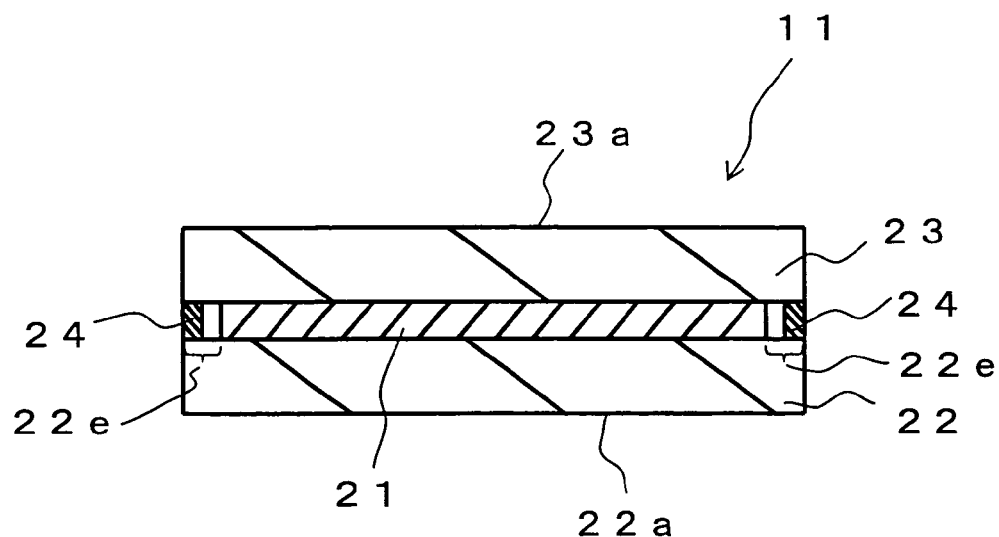
FIG. 1 is a view illustrating a schematic cross section of a hologram recording medium produced in an example.

A hologram recording material of the present invention comprises, as essential components, a metal oxide matrix and a photopolymerizable organic compound, and the metal oxide matrix is modified with a halogen-containing organic group. The metal oxide matrix has a network structure in a network form. The photopolymerizable organic compound is contained in this network.

When light having coherency is irradiated onto the hologram recording material made into a film form, the photopolymerizable organic compound undergoes polymerization reaction at the exposed part, so that the compound is made into a polymer. Furthermore, the photopolymerizable organic compound is diffused and shifted from the unexposed part to the exposed part, so that, at the exposed part, the compound is further made into a polymer. As a result, a region where the amount of the polymer produced from the photopolymerizable organic compound is large and a region where the amount of the polymer is small are formed in accordance with the distribution of the intensity of the light. At this time, the metal oxide matrix is shifted from the region where the amount of the polymer is large to the region where the amount of the polymer is small, so that the region where the amount of the polymer is large becomes a region where the amount of the metal oxide matrix is small and the region where the amount of the polymer is small becomes a region where the amount of the metal oxide matrix is large. In such a way, a region where the amount of the polymer is large and a region where the amount of the metal oxide matrix is large are formed by the exposure of the light. When there is a refractive index difference between the polymer and the metal oxide matrix, a refractive index change is recorded in accordance with the light intensity distribution.

About the level of the refractive indexes of the both of the organic polymer and the metal oxide matrix in the hologram recording material, a design may be made so as to make any one of the refractive indexes high. In general, the refractive index of the metal oxide matrix made mainly of a silicon oxide is lower than the refractive index of the organic polymer. It is advisable to make the refractive index of the metal oxide matrix low and make the refractive index of the organic polymer high. However, it is allowable to make the refractive index of the metal oxide matrix high and make the refractive index of the organic polymer low.

The metal oxide matrix in the present invention can be obtained, for example, by introducing a halogen-containing organic group into a matrix made of porous glass or the like by subjecting the matrix to various surface reforming treatments; introducing a halogen-containing organic group into water glass by subjecting the water glass to surface treatment; or introducing a halogen-containing organic group by crosslinking or polymerization reaction. It is advisable to fill and incorporate the photopolymerizable compound, which will be described later, into pores in the porous glass matrix.

The metal oxide matrix in the present invention is preferably formed by hydrolysis and polymerization reaction of a metal alkoxide compound, what is called, sol-gel reaction of the metal alkoxide compound. In the hologram recording material of the present invention, in order to introduce a halogen-containing organic group into the metal oxide matrix, there is used, as a component of the metal alkoxide compound, a metal alkoxide compound represented by the following general formula (1):

$$(R_H)_m M(OR)_n \qquad (1).$$

Herein, $R_H$ represents the halogen-containing organic group, R represents an alkyl group, M represents a metal atom, m represents 1 or 2, and m+n represents the valence of the metal atom M. $R_H$ may be differed in accordance with m, and R may be differed in accordance with n.

Examples of the metal atom M include Si, Al, Ti, Zr, Zn, In, Sn, and the like. Among them, Si is preferred.

The halogen-containing organic group represented by $R_H$ is, for example, a halogenated hydrocarbon group, in particular, a halogenated alkyl group. The halogen is preferably chlorine, and examples of the chlorinated hydrocarbon group include chlorinated alkyl groups such as a chloromethyl group (—CH$_2$Cl), a dichloromethyl group (—CHCl$_2$), a chloropropyl group (—CH$_2$CH$_2$CH$_2$Cl), a chlorobutyl group (—CH$_2$CH$_2$CH$_2$CH$_2$Cl), a 3-chlorobutyl group (—CH$_2$CH$_2$CHClCH$_3$), and 1,2-dichloroethyl group (—CHClCH$_2$Cl). The carbon number of the halogenated alkyl group is not limited, and is usually about 1 to 4.

Examples of the halogenated hydrocarbon group include not only the above-mentioned chlorinated hydrocarbon groups but also brominated alkyl groups such as a bromomethyl group (—CH$_2$Br) and a bromopropyl group (—CH$_2$CH$_2$CH$_2$Br), iodinated alkyl groups such as an iodopropyl group (—CH$_2$CH$_2$CH$_2$I), and chlorobrominated alkyl groups such as a chlorobromomethyl group (—CHClBr). When the metal oxide matrix is desired to have a high refractive index, bromine or iodine is preferably used as the halogen.

Examples of the halogen-containing organic group represented by R$_H$ also include ether-bond-containing groups such as a chloroethyloxymethyl group (—CH$_2$OCH$_2$CH$_2$Cl) and halogenated aromatic groups such as a chlorophenyl group (—C$_6$H$_4$Cl).

The alkyl group represented by R is preferably a lower alkyl group having 1 to 4 carbon atoms. Examples of the alkyl group represented by R include a methyl group, an ethyl group, a propyl group, an isopropyl group, a butyl group, an isobutyl group, a sec-butyl group, and the like.

Since the metal alkoxide compound represented by the general formula (1) has the halogen-containing organic group, the metal oxide matrix obtained by use of the metal alkoxide compound is very good in compatibility with the photopolymerizable compound and is also very good in compatibility with an organic polymer generated by the polymerization of the photopolymerizable compound at the time of recording.

In the present invention, an ordinal metal alkoxide compound having no halogen-containing organic group is used besides the metal alkoxide compound represented by the general formula (1). The metal alkoxide compound is represented by the following general formula (2):

$$(R_1)_m M(OR_2)_n \quad\quad (2).$$

Herein, R$_1$ represents an alkyl group or an aryl group, R$_2$ represents an alkyl group, M represents a metal atom, m represents 0, 1 or 2, and m+n represents the valence of the metal atom M. R$_1$ may be differed in accordance with m, and R$_2$ may be differed in accordance with n.

Examples of the metal atom M include Si, Al, Ti, Zr, Zn, In, Sn, and the like. Among them, Si is preferred.

The alkyl groups represented by R$_1$ and R$_2$ are usually lower alkyl groups having about 1 to 4 carbon atoms. Examples of the alkyl groups represented by R$_1$ and R$_2$ include a methyl group, an ethyl group, a propyl group, an isopropyl group, a butyl group, an isobutyl group, a sec-butyl group, and the like. An example of the aryl group represented by R$_1$ is a phenyl group.

Specific examples of a silicon compound out of the metal alkoxide compounds of the general formula (2) include trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, γ-mercaptopropyltrimethoxysilane, γ-mercaptopropyltriethoxysilane, γ-aminopropyltrimethoxysilane, γ-aminopropyltriethoxysilane, phenyltrimethoxysilane, phenyltriethoxysilane, phenyltripropoxysilane, and the like.

Of these silicon compounds, preferred are, for example, tetramethoxysilane, tetraethoxysilane, methyltrimethoxysilane, ethyltrimethoxysilane, methyltriethoxysilane, ethyltriethoxysilane, and the like.

As the need arises, a silicon compound wherein n=2 in the formula (2) may be used in the present invention in order to adjust the hardness and the flexibility of the matrix after gelation, or others. Examples of such a compound include dimethyldimethoxysilane, dimethyldiethoxysilane, and the like.

The use amount of the metal alkoxide compound of the general formula (1) in the whole of the metal alkoxide compound in the present invention is not specified without reservation since the amount depends on the network structure of the matrix and the content of the photopolymerizable organic compound. However, it is advisable to set the amount of the metal alkoxide compound of the general formula (1) into the range of, e.g., 0.05 to 1 mol, preferably 0.1 to 1 mol per mol of the whole of the metal alkoxide compound. When the metal oxide matrix is formed by a different production process, it is advisable to set the amount of the halogen-containing organic group represented by R$_H$ into the range of 0.05 to 1 equivalent of terminal groups of the metal oxide matrix.

As the photopolymerizable compound, a compound selected from a radical polymerizable compound and a cation polymerizable compound can be used.

The radical polymerizable compound is not particularly limited as long as the compound has in the molecule one or more radical polymerizable unsaturated double bonds. For example, a compound having a (meth)acryloyl group or a vinyl group can be used.

Examples of the compound having a (meth)acryloyl group out of such radical polymerizable compounds include phenoxyethyl (meth)acrylate, trimethylolpropane tri(meth)acrylate, pentaerythritol tetra(meth)acrylate, dipentaerythritol hexa(meth)acrylate, diethylene glycol di(meth)acrylate, triethylene glycol di(meth)acrylate, tetraethylene glycol di(meth)acrylate, polyethylene glycol di(meth)acrylate, bis (2-hydroxyethyl) isocyanurate di(meth)acrylate, 2,2-bis[4-(acryloxy-diethoxy)phenyl]propane, and the like. However, the compound having a (meth)acryloyl group is not necessarily limited thereto.

Examples of the compound having a vinyl group include divinylbenzene, ethylene glycol divinyl ether, diethylene glycol divinyl ether, triethylene glycol divinyl ether, and the like. However, the compound having a vinyl group is not necessarily limited thereto.

One kind of the radical polymerizable compound may be used, and two or more kinds thereof are used together. In the case that a compound having an aromatic ring is used, an organic polymer having a higher refractive index is obtained. And a difference of the refractive index of the organic polymer from the refractive index of the metal oxide matrix made mainly of a silicon oxide and having a low refractive index is easily obtained. Thus, the case is preferred. As the photopolymerizable compound, an oligomer of any one of the radical polymerizable compounds exemplified above may be used.

The cation polymerizable compound is not particularly limited about the structure as long as the compound has at least one reactive group selected from a cyclic ether group and a vinyl ether group.

Examples of the compound having a cyclic ether group out of such cation polymerizable compounds include compounds having an epoxy group, an alicyclic epoxy group or an oxetanyl group.

Specific examples of the compound having an epoxy group include bisphenol A diglycidyl ether, Novolak type epoxy resins, trisphenolmethane triglycidyl ether, 1,4-butanediol diglycidyl ether, 1,6-hexanediol diglycidyl ether, glycerin triglycidyl ether, trimethylolpronane triglycidyl ether, propylene glycol diglycidyl ether, polyethylene glycol diglycidyl ether, and the like.

Specific examples of the compound having an alicyclic epoxy group include 2,4-epoxycyclohexylmethyl-3,4-epoxycyclohaxane carboxylate, bis(3,4-epoxycyclohexylmethyl) adipate, 2-(3,4-epoxycyclohexyl-5,5-spiro-3,4-epoxy) cyclohexanone-meta-dioxane, bis(2,3-epoxycyclopentyl)

ether, EHPE-3150 (alicyclic epoxy resin, manufactured by Dicel Chemical Industries, Ltd.), and the like.

Specific examples of the compound having an oxetanyl group include 1,4-bis[(3-ethyl-3-oxetanylmethoxy)methyl]benzene, 1,3-bis[(3-ethyl-3-oxetanylmethoxy)methyl]propane, ethylene glycol bis(3-ethyl-3-oxetanylmethyl) ether, trimethylolpropane tris(3-ethyl-3-oxetanylmethyl) ether, pentaerythritoltetrakis(3-ethyl-3-oxetanylmethyl) ether, dipentaerythritol hexakis(3-ethyl-3-oxetanylmethyl) ether, ethylene oxide modified bisphenol A bis(3-ethyl-3-oxetanylmethyl) ether, and the like.

Specific examples of the compound having a vinyl ether group, out of the cation polymerizable compounds, include triethylene glycol divinyl ether, tetraethylene glycol divinyl ether, trimethylolpropane trivinyl ether, cyclohexane-1,4-dimethylol divinyl ether, 1,4-butanediol divinyl ether, polyester divinyl ether, polyurethane polyvinyl ether, and the like.

One kind of the cation polymerizable compound may be used, or two or more kinds thereof may be used together. In the case that a compound having an aromatic ring is used, an organic polymer having a higher refractive index is obtained and a difference of the refractive index of the organic polymer from the refractive index of the metal oxide matrix made mainly of a silicon oxide and having a low refractive index is easily obtained. Thus, the case is preferred. As the photopolymerizable compound, an oligomer of any one of the cation polymerizable compounds exemplified above may be used.

It is advisable to use the photopolymerizable compound in an amount of, e.g., about 10 to 1000% by weight, preferably 50 to 500% by weight with respect to the weight of the cured metal oxide matrix in the present invention. If the amount is less than 10% by weight, a large refractive index change is not easily obtained at the time of recording. If the amount exceeds 1000% by weight, a large refractive index change is not easily obtained likewise at the time of recording.

In the present invention, it is preferred that the hologram recording material further contains a photopolymerization initiator corresponding to the wavelength of recording light. When the photopolymerization initiator is contained in the hologram recording material, the polymerization of the photopolymerizable compound is promoted by the exposure of light at the time of recording. Consequently, a higher sensitivity is achieved.

When a radical polymerizable compound is used as the photopolymerizable compound, a photo radical initiator is used. On the other hand, when a cation polymerizable compound is used as the photopolymerizable compound, a photo cation initiator is used.

Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the radical polymerizable compound.

As the photo cation initiator, for example, an onium salt such as a diazonium salt, a sulfonium salt, or a iodonium salt can be used. It is particularly preferred to use an aromatic onium salt. Besides, an iron-arene complex such as a ferrocene derivative, an arylsilanol-aluminum complex, or the like can be preferably used. It is advisable to select an appropriate initiator from these. Specific examples of the photo cation initiator include Cyracure UVI-6970, Cyracure UVI-6974 and Cyracure UVI-6990 (each manufactured by Dow Chemical Co. in USA), Irgacure 264 and Irgacure 250 (each manufactured by Ciba Specialty Chemicals Inc.), and CIT-1682 (manufactured by Nippon Soda Co., Ltd.). The content of the photo cation initiator is, for example, about 0.1 to 10% by weight, preferably about 0.5 to 5% by weight on the basis of the cation polymerizable compound.

It is preferred that the photopolymerization initiator contains a dye or the like that functions as a sensitizer corresponding to the wavelength of recording light besides the initiator.

It is preferred that the photopolymerization initiator is decomposed in order to stabilize hologram recording after the recording. Usually, the initiator is decomposed by sufficient irradiation of light after the recording.

Next, the production of the hologram recording material will be described.

First, a metal alkoxide mixture containing a metal alkoxide compound represented by the general formula (1) and a metal alkoxide compound represented by the general formula (2) at a determined ratio is hydrolyzed and polymerized to obtain a metal oxide matrix precursor.

The hydrolysis polymerization reaction can be carried out through the same operations and conditions as in a known sol-gel process. For example, the metal alkoxide compound represented by the general formula (1) and the metal alkoxide compound represented by the general formula (2), the ratio therebetween being the determined ratio, are dissolved into an appropriate good solvent so as to prepare a homogeneous solution. An appropriate acid catalyst is dropped into the solution. The solution is stirred in the presence of water, whereby the reaction can be conducted.

Examples of such a solvent include: water; alcohols such as methanol, ethanol, propanol, isopropanol, and butanol; ethers such as diethyl ether, dioxane, dimethoxyethane and tetrahydrofuran; and n-methylpyrrolidone, acetonitrile, dimethylformamide, dimethylacetoamide, dimethylsulfoxide, acetone, benzene, and the like. The solvent may be appropriately selected from these. Preferably, an alcohol is preferred. Alternatively, a mixture of these may be used. The amount of the solvent is not limited, and is preferably 10 to 1000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis polymerization reaction can be generally conducted at room temperature, which depends on the reactivity of the metal alkoxide compounds. The reaction can be conducted at a temperature of about 0 to 150° C., preferably at a temperature of about room temperature to 50° C. The reaction time may be appropriately determined, correspondingly to the relationship with the reaction temperature. The time is about 1 to 240 hours. The reaction may be conducted in an inert atmosphere such as nitrogen gas, or may be conducted under a reduced pressure of about 0.5 to 1 atom while the alcohol produced by the polymerization reaction is removed.

Before or after the hydrolysis, a photopolymerizable organic compound is mixed therewith. The photopolymerizable organic compound and the metal alkoxide compound may be mixed after the hydrolysis, or may be mixed before the hydrolysis. In the case of mixing after the hydrolysis, it is preferred to add the photopolymerizable organic compound to the metal oxide matrix precursor in a sol state and mix them in order to mix them homogeneously. The incorporation of the photopolymerization initiator can also be conducted before or after the above-mentioned hydrolysis.

The metal oxide matrix precursor in the sol state, with which the photopolymerizable organic compound is homogeneously mixed, is cured to form a metal oxide matrix. After the homogeneous mixing of the photopolymerizable organic compound, the resultant undergoes the drying of the solvent and the polymerization reaction of the alkoxide, thereby producing a hologram recording material wherein the photopolymerizable organic compound and the photopolymerization initiator as an optional component are contained in a metal oxide matrix network. The sol-state metal oxide matrix precursor is applied onto a substrate, dried and cured to produce a film-form hologram recording material.

In the present invention, the metal alkoxide compound of the general formula (1), which has a halogen-containing organic group, is used as a raw material component of the metal oxide matrix; therefore, it is very good in compatibility with the photopolymerizable compound in any one of the stages for producing the hologram recording material. In other words, the compatibility between the sol-state metal oxide matrix precursor and the photopolymerizable compound is very good, and the compatibility between the cured metal oxide matrix and the photopolymerizable compound is also very good.

The use of the hologram recording material of the present invention makes it possible to obtain a hologram recording medium having a recording film thickness of 100 μm or more, which is suitable for data storage. The hologram recording medium can be produced by forming the hologram recording material in a film form onto a substrate made of glass, resin or the like, or by putting the hologram recording material in a film form between substrates. The recording film thickness of the hologram recording medium is 10 μm to 5 mm. The thickness is preferably 100 μm or more in order for the film to have high multiplicity and be suitable for data storage.

According to the hologram recording medium of the present invention, a problem of light scattering is not caused since the recording film is uniform. Further, at the time of recording, the photopolymerizable organic compound in exposed parts is polymerized and the compatibility between the metal oxide matrix and the polymer is very good since the metal oxide matrix has a halogen-containing organic group. For this reason, according to the hologram recording medium of the present invention, the compatibility is sufficiently kept even during or after recording. Thus, problems of light scattering and lowering of transmittance are not caused. In general, the compatibility of the metal oxide matrix with a polymer resulting from the photopolymerizable organic compound (monomer) is lower than that of the matrix with the organic compound.

EXAMPLES

The present invention will be more specifically described by way of the following examples. However, the present invention is not limited to the examples.

Example 1

A sol-gel process was used to produce a hologram recording material through the following steps.

(Metal Oxide Matrix)

In a solvent (5 mL of tetrahydrofuran), 6.2 g of tetraethoxysilane ($Si(OC_2H_5)_4$) and 3.6 g of chloropropyltriethoxysilane ($ClC_3H_6$—$Si(OC_2H_5)_3$) were mixed to prepare an alkoxide solution. The ratio by mole of $Si(OC_2H_5)_4$ to $ClC_3H_6$—$Si(OC_2H_5)_3$ was 2/1. Into the alkoxide solution were dropped a solution of 1.5 mL of water, 0.5 mL of a 1 N aqueous solution of hydrochloric acid, and a solvent (5 mL of isopropanol) at room temperature while the alkoxide solution was stirred. The stirring was continued for 6 hours to conduct a hydrolysis reaction. In this way, a sol solution of a silicon oxide compound into which a chloropropyl group was introduced was obtained.

(Photopolymerizable Organic Compound)

The following were mixed as high refractive index monomers having an aromatic ring: 50 parts by weight of phenoxyethyl acrylate (AMP-10G, manufactured by Shin-Nakamura Chemical Co., Ltd.) and 50 parts by weight of 2,2-bis[4-(acryloxy-diethoxy)phenyl]propane (A-BPE-4, manufactured by Shin-Nakamura Chemical Co., Ltd.). 3 parts by weight of IRG-784 (Ciba Specialty Chemicals Inc.) were added to the resultant mixture as a photopolymerization initiator, and were mixed with the mixture.

(Hologram Recording Material Solution)

The sol solution of the silicon oxide and the photopolymerizable organic compound were mixed at room temperature to make the ratio by weight of the matrix material to the photopolymerizable organic compound finally into 1:2. In this way, a yellow transparent solution of a hologram recording material was obtained.

(Hologram Recording Material)

Description will be given with reference to FIG. 1, which illustrates a schematic cross section of a hologram recording medium.

A glass substrate (22) on one surface of which an anti-reflection film (22a) was formed was prepared. The obtained hologram recording material solution was applied onto the surface of the glass substrate (22) on which the anti-reflection film (22a) was not formed with the exception of an end portion (22e) of the substrate, so as to make the dry film thickness into 100 μm. The resultant was then dried for 24 hours at room temperature to volatilize the solvent. Through the drying step, the gelation (polymerization reaction) of the metal oxide was advanced to obtain an organic-inorganic hybrid hologram recording material film (21) wherein the photopolymerizable organic compound was contained in a metal oxide matrix network.

(Hologram Recording Medium)

A spacer (24) of 100 μm thickness was put on the end portion (22e) of the glass substrate (22) on which the hologram recording material film (21) was formed, and then the hologram recording material film (21) was covered with another glass substrate (23) on one surface of which an anti-reflection film (23a) was formed. At this time, the covering was performed to bring the surface of the glass substrate (23) on which the anti-reflection film (23a) was not formed into contact with the surface of the hologram recording material film (21). This manner gave a hologram recording medium (11) having a structure that the hologram recording material film (21) was sandwiched between the two glass substrates (22) and (23).

(Characteristic Evaluation)

Figure 2:
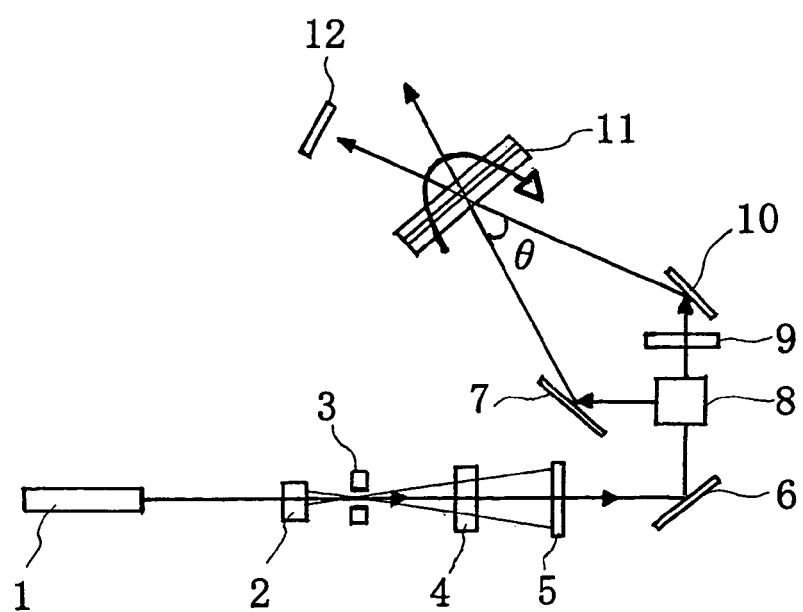
FIG. 2 is a view illustrating the outline of a hologram recording optical system used in the example.

About the resultant hologram recording medium sample, characteristics were evaluated in a hologram recording optical system as illustrated in FIG. 2.

In the hologram recording optical system in FIG. 2, a light source (1) of Nd:YAG laser (532 nm) was used, and light oscillated from the light source (1) was spatially filtered and collimated through a lens (2), a pin hole (3), a shutter (4) and a lens (5). The light was split with a beam splitter (8) to set the total incident angle θ of the two luminous fluxes to the hologram recording medium sample (11) into 36.9°. The interference of the two luminous fluxes was recorded with the sample (11). The sample (11) was rotated in the horizontal direction to multiply the angle, thereby recording a hologram (sample angle: −7.5° to +7.5°, angle interval: 3°, and 6-piece multiplicity). After the recording of the hologram, only one luminous flux was sufficiently irradiated thereto in order to cause the remaining unreacted components to react. About reproduction, a shutter (9) was used to irradiate only one luminous flux thereto, and the diffraction efficiency was measured with a power meter (12) while the sample (11) was rotated. In FIG. 2, reference numerals (6), (7) and (10) denote mirrors.

At this time, the obtained dynamic range: M# (the sum of square roots of values of the diffraction efficiency) was a high value of 1.6. The transmittance at 532 nm (the recording wavelength) did not decrease before and after the recording.

Comparative Example 1

In a solvent (5 mL of tetrahydrofuran), 6.2 g of tetraethoxysilane ($Si(OC_2H_5)_4$) and 2.7 g of methyltriethoxysilane ($CH_3$—$Si(OC_2H_5)_3$) were mixed to prepare an alkoxide solution. The ratio by mole of $Si(OC_2H_5)_4$ to $CH_3$—$Si(OC_2H_5)_3$ was 2/1. In the same way as in Example 1 except that the metal oxide matrix raw materials were changed in this manner, a sol solution of a silicon oxide was obtained.

The resultant sol solution of the methyl-introduced silicon oxide and the same photopolymerizable organic compound as used in Example 1 were mixed with each other at room temperature to make the ratio by weight of the matrix material and the photopolymerizable organic compound finally into 1:2. As a result, they were not dissolved in each other, so as to become clouded.

The hologram recording material solution was applied onto a glass substrate and then dried in the same way as in Example 1. As a result, the matrix material and the organic compound were separated and were not hybridized. Thus, hologram recording was not permitted.

Comparative Example 2

In a solvent (5 mL of tetrahydrofuran), 6.2 g of tetraethoxysilane ($Si(OC_2H_5)_4$) and 3.6 g of phenyltriethoxysilane ($C_6H_5$—$Si(OC_2H_5)_3$) were mixed to prepare an alkoxide solution. The ratio by mole of $Si(OC_2H_5)_4$ to $C_6H_5$—$Si(OC_2H_5)_3$ was 2/1. In the same way as in Example 1 except that the metal oxide matrix raw materials were changed in this manner, a sol solution of a silicon oxide was obtained.

The resultant sol solution of the phenyl-introduced silicon oxide and the same photopolymerizable organic compound as used in Example 1 were mixed with each other at room temperature to make the ratio by weight of the matrix material and the photopolymerizable organic compound finally into 1:2, thereby obtaining a yellow transparent hologram recording material solution.

The hologram recording material solution was applied onto a glass substrate and then dried in the same way as in Example 1 to form a hologram recording material film. Furthermore, a hologram recording medium having a structure that the recording material film was sandwiched between two glass substrates was obtained.

About the resultant hologram recording medium sample, characteristics were evaluated in the same way as in Example 1. At this time, the dynamic range: M# was 0.7, which was a lower value than the value of Example 1. In the recorded sites (exposed parts), white cloudiness was generated and the transmittance at 532 nm decreased by 5% on the basis of the value before the recording.

As described above, the introduction of a phenyl group into the metal oxide matrix exhibited a larger effect for compatibility-improvement than the introduction of a methyl group into the metal oxide matrix. However, the compatibility with the polymer generated at the time of recording was insufficient.

The invention claimed is:

1. A hologram recording material comprising:
a metal oxide matrix; and
a photopolymerizable compound having an aromatic ring,
wherein the metal oxide matrix is formed by hydrolysis and polymerization reaction of a metal alkoxide compound, and said metal alkoxide compound includes
a metal alkoxide compound having a halogen-containing organic group represented by the following general formula (1):

$(R_H)_m M(OR)_n$     (1)

wherein $R_H$ represents a halogenated $C_{1-4}$ alkyl group,
R represents an alkyl group,
M represents a metal atom selected from the group consisting of Si, Al, Ti, Zr, Zn, In and Sn,
m represents 1 or 2, and
m+n represents the valence of the metal atom M; and
a metal alkoxide compound having no halogen-containing organic group represented by the following general formula (2):

$M(OR_2)_n$     (2)

wherein
$R_2$ represents an alkyl group,
M represents a metal atom selected from the group consisting of Si, Al, Ti, Zr, Zn, In and Sn,
and n represents the valence of the metal atom M.

2. The hologram recording material according to claim 1, wherein the metal oxide matrix is made mainly of an oxide of silicon.

3. The hologram recording material according to claim 1, further comprising a photopolymerization initiator.

4. A hologram recording medium having the hologram recording material according to claim 1 on a substrate.

5. The hologram recording material of claim 1, wherein said halogenated $C_{1-4}$ alkyl group is at least one group selected from the group consisting of chloromethyl, dichloromethyl, chloropropyl, chlorobutyl, 3-chlorobutyl and 1,2-dichloroethyl.

6. The hologram recording material of claim 1, wherein said halogenated $C_{1-4}$ alkyl group is at least one group selected from the group consisting of bromomethyl, bromopropyl, iodopropyl and chlorobromomethyl.

7. The hologram recording material of claim 1, which is in the form of a film of a thickness of 100 μm or more.

8. The hologram recording material of claim 1, which is in the form of a film of a thickness of 100 μm to 5 mm.

9. The hologram recording material of claim 1, comprising 10 to 1000 wt. % of said photopolymerizable compound relative to a weight of said metal oxide matrix.

10. The hologram recording material of claim 1, comprising 50 to 500 wt. % of said photopolymerizable compound relative to a weight of said metal oxide matrix.

11. The hologram recording material of claim 1, wherein said metal oxide matrix is compatible with said photopolymerizable compound in the sol-state and in the cured state.

12. A process for producing a hologram recording material, the process comprising:

hydrolyzing a metal alkoxide compound which includes a metal alkoxide compound having a halogen-containing organic group represented by the following general formula (1):

$$(R_H)_m M(OR)_n \tag{1}$$

wherein $R_H$ represents a halogenated $C_{1-4}$ alkyl group,

R represents an alkyl group,

M represents a metal atom selected from the group consisting of Si, Al, Ti, Zr, Zn, In and Sn, m represents 1 or 2, and m+n represents the valence of the metal atom M, and a metal alkoxide compound having no halogen-containing organic group represented by the following general formula (2):

$$M(OR_2)_n \tag{2}$$

wherein $R_2$ represents an alkyl group,

M represents a metal atom selected from the group consisting of Si, Al, Ti, Zr, Zn, In and Sn, and n represents the valence of the metal atom M thereby yielding a precursor of a metal oxide matrix;

mixing a photopolymerizable compound having an aromatic ring before or after said hydrolysis; and curing the metal oxide matrix precursor mixed with the photopolymerizable compound, thereby forming a metal oxide matrix.

* * * * *